(12) United States Patent
Smith et al.

(10) Patent No.: US 7,768,619 B2
(45) Date of Patent: Aug. 3, 2010

(54) METHOD AND APPARATUS FOR SEALING FLEX CIRCUITS MADE WITH AN LCP SUBSTRATE

(75) Inventors: C. W. Sinjin Smith, Palm Bay, FL (US); Charles M. Newton, Palm Bay, FL (US); Paul B. Jaynes, Indialantic, FL (US)

(73) Assignee: Harris Corporation, Melbourne, FL (US)

( * ) Notice: Subject to any disclaimer, the term of this patent is extended or adjusted under 35 U.S.C. 154(b) by 1240 days.

(21) Appl. No.: 10/910,715

(22) Filed: Aug. 3, 2004

(65) Prior Publication Data

US 2006/0028612 A1   Feb. 9, 2006

(51) Int. Cl.
G02F 1/13   (2006.01)
(52) U.S. Cl. ..................................... 349/187
(58) Field of Classification Search ................. 349/187, 349/190; 156/285; 264/604, 667, 100
See application file for complete search history.

(56) References Cited

U.S. PATENT DOCUMENTS

| | | | |
|---|---|---|---|
| 2,575,734 A | 12/1947 | Schulman | |
| 5,184,211 A * | 2/1993 | Fox | 257/706 |
| 5,538,789 A * | 7/1996 | Capote et al. | 428/344 |
| 5,788,808 A * | 8/1998 | Natarajan et al. | 156/580 |
| 5,827,999 A | 10/1998 | McMillan et al. | 174/52.4 |
| 5,885,668 A * | 3/1999 | Culbertson et al. | 428/1.55 |
| 6,320,257 B1 | 11/2001 | Jayaraj et al. | 257/723 |
| 6,372,992 B1 * | 4/2002 | Yang | 174/117 F |
| 6,452,798 B1 | 9/2002 | Smith et al. | 361/699 |
| 6,459,581 B1 | 10/2002 | Newton et al. | 361/700 |
| 6,483,705 B2 | 11/2002 | Snyder et al. | 361/709 |
| 6,952,046 B2 * | 10/2005 | Farrell et al. | 257/678 |
| 2002/0155279 A1 * | 10/2002 | Dai et al. | 428/335 |
| 2003/0207048 A1 | 11/2003 | St. Lawrence et al. | 428/1.2 |
| 2004/0010910 A1 | 1/2004 | Farrell et al. | 29/830 |
| 2004/0012083 A1 | 1/2004 | Farrell et al. | 257/704 |

FOREIGN PATENT DOCUMENTS

DE   199 20 577 C1   1/2001
JP   2001 230528 A   8/2001

OTHER PUBLICATIONS

"An Overcoat for PCBS;" Machine Design, Penton Media, Cleveland, OH; vol. 73, No. 10, May 17, 2001; p. 116, XP001198851.

* cited by examiner

*Primary Examiner*—Timothy Rude
(74) *Attorney, Agent, or Firm*—GrayRobinson, P.A.

(57) ABSTRACT

A method and apparatus is disclosed for affixing a cover layer formed of liquid crystal polymer to a flex circuit consisting of circuit elements mounted to a liquid crystal polymer substrate in order to encapsulate the circuit elements between the cover layer and substrate to protect them from exposure to moisture and contaminants.

3 Claims, 2 Drawing Sheets

METHOD AND APPARATUS FOR SEALING FLEX CIRCUITS MADE WITH AN LCP SUBSTRATE

FIELD OF THE INVENTION

This invention is directed to flexible circuits, and, more particularly, to a method and apparatus for sealing circuit elements of a flexible circuit mounted on a substrate formed of liquid crystal polymer to protect them from exposure to moisture and contaminants.

BACKGROUND OF THE INVENTION

Flexible or "flex" circuits are used in a wide variety of applications where an electrical circuit must bend around corners or be flexed during operation. Flex circuits are thin, light weight, flexible and exhibit high routability. Traditionally, polyimide films have been used as substrates in the manufacture of flex circuits due to their good thermal stability and mechanical strength. Other properties of polyimide films, however, limit the speed or frequency at which electric components mounted thereto can operate.

Liquid crystal polymer ("LCP") has been developed in recent years as a replacement for polyimide films in flex circuits. LCP is a thermoplastic aromatic polyester which is thermally stable, with an upper use temperature in excess of 250° C. and good inherent flame retardant properties. LCP films, in comparison to polyimide films, have about one-tenth of the moisture uptake and a lower coefficient of humidity expansion. Lower moisture absorption leads to higher frequency signal and data processing. Additionally, LCP films have a lower dielectric constant and a lower loss or dissipation factor over the functional frequency range of 1 kHz to 45 GHz, with negligible moisture effects, compared to polyimide films.

The fabrication of flex circuits with LCP films is expected to lead to their use in more demanding environments where moisture and other contaminants are prevalent. Particularly in such types of applications, the circuit elements applied to the LCP substrate of the flex circuit must be protected from damage. Soldermask coatings, which have been employed to provide protection from moisture and contaminants in polyimide films, have been considered for use with LCP substrates. Additionally, due to the thermoplastic nature of LCP, the application of an LCP film cover layer to an LCP substrate has been proposed as a means of effectively encapsulating circuit elements. There is a need, however, for an efficient and dependable method and apparatus to perform such an encapsulation operation.

SUMMARY OF THE INVENTION

This invention is directed to a method and apparatus for affixing an LCP cover layer to a flex circuit consisting of circuit elements mounted to an LCP substrate in order to protect the circuit elements from damage and/or reduced operational efficiency due to the presence of moisture and contaminants.

In the presently preferred embodiment, the apparatus includes an iso-static press having a hollow interior connected to a source of oil or other liquid whose temperature can be accurately controlled and maintained. The oil is heated to a temperature in the range of approximately 283° C. to 320° C. and transferred from a tank into the interior of the press. The base of the press has a plate or membrane formed of a flexible material covered with a non-stick surface which does not adhere to LCP.

The flex circuit is placed on a support such that the circuit elements are exposed. An LCP cover layer is then placed atop the flex circuit, after which time the press is activated to move into contact with the cover layer. The flexible membrane at the base of the press is capable of substantially conforming to the shape of the circuit elements, thus urging the LCP cover layer around them to the underlying LCP substrate of the flex circuit. The temperature and pressure applied by the press is sufficient to cause the LCP cover layer and substrate to "flow" or melt to a limited extent and thus adhere together forming a secure bond so that the circuit elements between the two are substantially encapsulated.

BRIEF DESCRIPTION OF THE DRAWINGS

The structure, operation and advantages of the presently preferred embodiment of this invention will become further apparent upon consideration of the following description, taken in conjunction with the accompanying drawings, wherein.

DETAILED DESCRIPTION OF THE INVENTION

Figure 1:
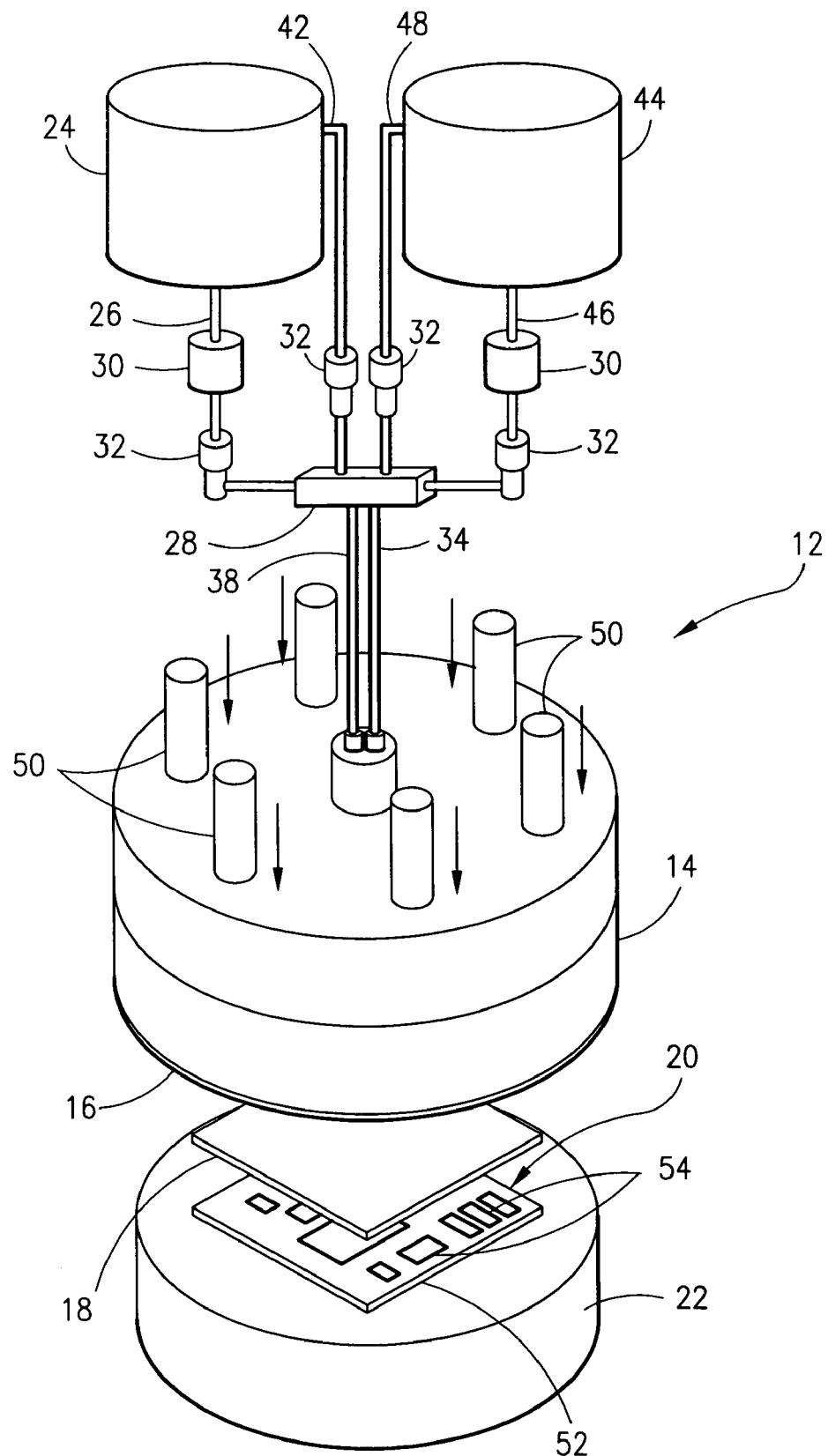
FIG. 1 is a schematic, perspective view of the apparatus of this invention.

Referring now to the Figs., the apparatus 10 of this invention is schematically illustrated. The apparatus 10 includes an iso-static press 12 having a housing 14 formed with a hollow interior. The base of the housing 14 mounts a flexible membrane 16 having an exposed surface coated with Teflon® or other release agent which will not stick to LCP, and an inside surface coated with a hydrophobic film. Preferably, the flexible membrane 16 is formed of high density polyethylene, butyl rubber, ethylene propylene diene monomer rubber or a similar material.

As discussed in more detail below, the press 12 is operative to apply heat and pressure against a cover layer 18 which overlies a flex circuit 20 placed upon a support 22. In the presently preferred embodiment, the press 12 is heated by the introduction into its hollow interior of heated oil or a similar fluid whose temperature can be relatively accurately controlled and maintained within the range of about 283° C. to 325° C. A first reservoir 24 having heating elements (not shown) containing a valve 32, is connected by a supply line 26 to a manifold 28. A pump 30 and valve 32 are located in the supply line 26, between the first reservoir 24 and manifold 28, as shown. The manifold 28, in turn, is connected by an input line 34 to one port at the top of the press 12, and by an output line 38 to a second port. A recirculation line 42, containing a valve 32, is connected between the manifold 28 and the top of the first reservoir 24.

In view of the relatively high temperature obtained by the press 12 during operation, it is advantageous to provide a cooling capability to step the temperature down. To that end, a second reservoir 44 is provided which contains the same fluid as first reservoir 24 except at ambient temperature. The bottom of second reservoir 44 is connected by a line 46 to the manifold 28, and a recirculation line 48 connects the manifold 28 to the top of the second reservoir 44. A pump 30 and valve 32 are located in the line 46 between the second reservoir 44 and manifold 28, and a valve 32 is mounted in the recirculation line 48.

The press 12 is moved with respect to the support 22 by a number of pneumatic or hydraulic pistons 50 which are mounted at equal intervals along the top surface of the press 12. Conventionally, the pistons 50 are independently actuated by a source of air or fluid (not shown) to ensure that the press 12 applies uniform pressure to the cover layer 18 and flex circuit 20 over the entire surface area of the flexible membrane 16. The detailed construction of the press 12 forms no part of this invention, and is therefore not discussed further herein.

System Operation

As discussed above, the method and apparatus 10 of this invention are designed to provide a means for encapsulating circuit elements to protect them from moisture and contaminants. The flex circuit 20 consists of a substrate 52 formed of LCP upon which a number of circuit elements 54 are mounted. The cover layer 18 is also formed of LCP, which, because of its thermoplastic nature, will "flow" or begin to melt at a temperature of about 283° C. By placing the cover layer 18 over the flex circuit 20 and applying heat and pressure, the cover layer 18 and substrate 52 adhere to one another with a secure bond and entirely enclose the circuit elements 54 between them.

Figure 2:
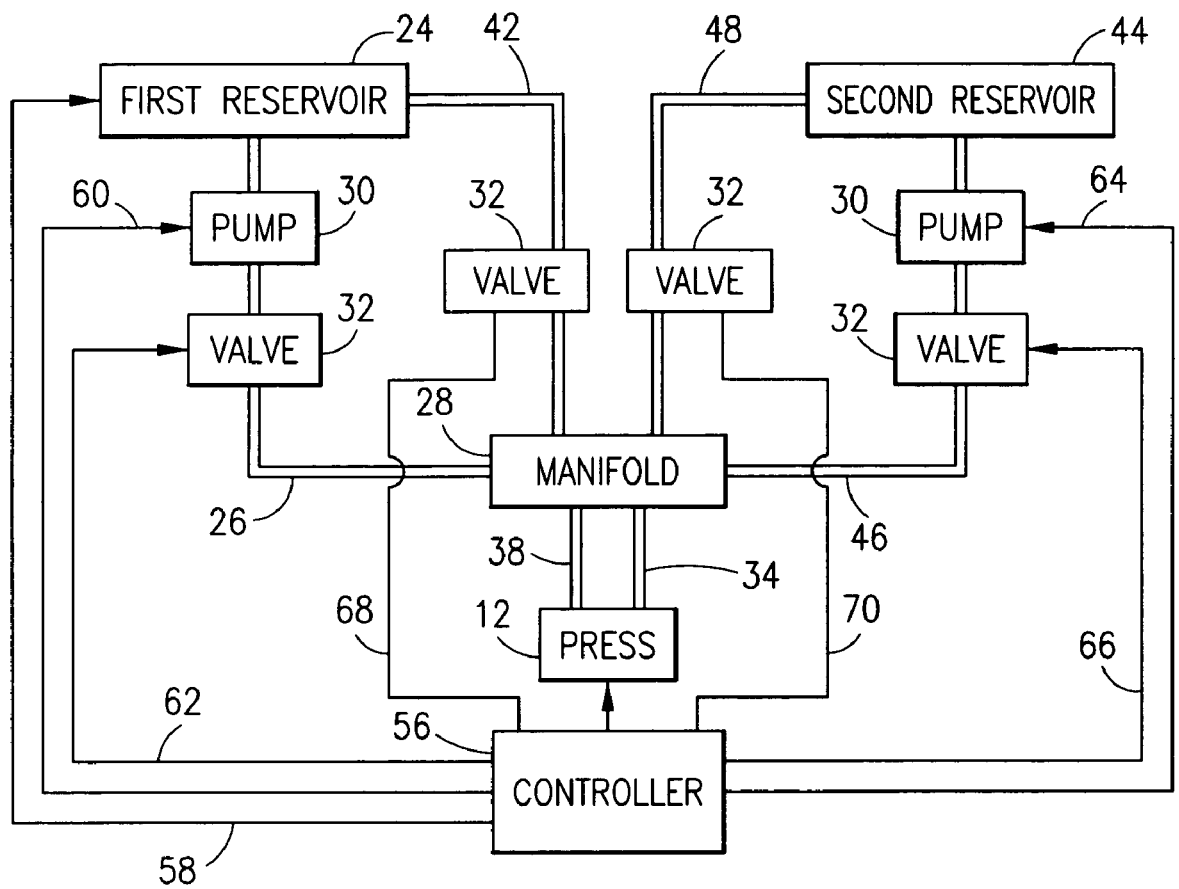
FIG. 2 is a block diagram illustrating the operation of the apparatus shown in FIG. 1.

The apparatus 10 is operated by a commercially available controller 56 as schematically depicted in the flow diagram of FIG. 2. Initially, oil or other fluid within the first reservoir 24 is brought up to a temperature in the range of 283° C. to 325° C. by activating heating elements (not shown) therein. The controller 56 is operative to activate the heating elements via a signal input through lead 58, or they may be independently activated by a switch (not shown) located at the first reservoir 24. The controller 56 then inputs signals through leads 60 and 62 to start the pump 30 and open valve 32, respectively, thus initiating the flow of heated oil out of the first reservoir 24. When it is desired to heat the press 12 in preparation for circuit encapsulation, the controller 56 deactivates the pump 30 and valve 32 in line 46 from second reservoir 44 by signals input through leads 64 and 66, respectively. The heated oil flows into the press 12 through the manifold 28 and into the input line 34 leading into the interior of the press 12. Preferably, the temperature of the heated oil within the press 12 is controlled and maintained by continuously recirculating it from the first reservoir 24 through the manifold 28 and input line 34 into the press 12, and then out of the press 12 through the output line 38 and manifold 28 to the recirculation line 42 connecting the manifold 28 to the first reservoir 24. The controller 56 opens the valve 32 within recirculation line 42 via a signal input through line 68 to allow the heated oil to pass from the manifold 28 into the first reservoir 24.

With the press 12 at the appropriate temperature, the encapsulation process can proceed. The flex circuit 16 is positioned on the support 22 so that the circuit elements 54 on the LCP substrate 52 are exposed. The LCP cover layer 18 is then placed atop the substrate 52 and circuit elements 54. The controller 56 operates the pistons 50 causing the press 12 to move toward the support 22. Upon engagement of the flexible membrane 16 at the bottom of the press 12 with the cover layer 18, at a uniform pressure on the order of 200 psi, the flexible plate 16 substantially conforms to the shape of the circuit elements 54 beneath. In turn, the cover layer 18 is forced around the circuit elements 54 into contact with substrate 52. The press 12 is maintained in this position for a period of time sufficient to heat both the LCP cover layer 18 and LCP substrate 52 to a melt temperature of at least 283° C., but not more than about 320° C., causing them to bond to one another and thus encapsulate the circuit elements 54 between the two.

After completing one or more encapsulation procedures, the temperature of the press 12 may be stepped down by circulating comparatively cool, ambient temperature oil into the press 12 from the second reservoir 44. The controller 56 is operative to deactivate the pump 30 and close valve 32 within line 26 connected to the first reservoir 24, while activating pump 30 and opening valve 32 within the line 46 connected to the second reservoir 44. The controller 56 closes the valve 32 within the recirculation line 42, and then opens the valve 32 within the recirculation line 48 extending from the manifold 28 to the second reservoir 44 by inputting a signal to such valve 32 through a line 70. As a result, ambient temperature oil is recirculated within the press 12 to reduce its temperature.

While the invention has been described with reference to a preferred embodiment, it should be understood by those skilled in the art that various changes may be made and equivalents substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for sealing elements of an electrical circuit, comprising:
    (a) providing a substrate formed of a liquid crystal polymer having a number of circuit elements mounted thereto;
    (b) positioning the substrate on a support so that the circuit elements are exposed;
    (c) placing a substantially planar cover sheet formed of liquid crystal polymer over the exposed circuit elements on the substrate; and
    (d) directing a heated press against the substantially planar cover sheet so that a flexible membrane of the heated press substantially conforms to the shape of the circuit elements on the substrate, the heated press exerting sufficient heat and pressure to cause the liquid crystal polymer material of the substantially planar cover sheet to extend around the circuit elements and into contact with the substrate so that both the cover sheet and the substrate adhere together thus sealing the circuit elements between the two.

2. The method of claim 1 in which step (d) includes providing an iso-static press which is effective to apply a substantially uniform pressure to the cover sheet and substrate.

3. The method of claim 1 in which step (d) includes forming the flexible membrane with a non-stick surface for engagement with the cover sheet.

* * * * *